(12) United States Patent
Li et al.

(10) Patent No.: US 8,760,173 B2
(45) Date of Patent: *Jun. 24, 2014

(54) SIGNAL TEST APPARATUS FOR SAS DEVICES

(75) Inventors: Hui Li, Shenzhen (CN); Fa-Sheng Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 232 days.

This patent is subject to a terminal disclaimer.

(21) Appl. No.: 13/221,917

(22) Filed: Aug. 31, 2011

(65) Prior Publication Data

US 2013/0043883 A1    Feb. 21, 2013

(30) Foreign Application Priority Data

Aug. 17, 2011  (CN) .......................... 2011 1 0236009

(51) Int. Cl.
  *G01R 27/00*  (2006.01)
  *G01R 1/00*  (2006.01)
  *H05K 1/00*  (2006.01)
  *H05K 1/16*  (2006.01)

(52) U.S. Cl.
  CPC  *G01R 27/00* (2013.01); *G01R 1/00* (2013.01); *H05K 1/00* (2013.01); *H05K 1/16* (2013.01)
  USPC .................. 324/600; 324/76.12; 324/756.04; 324/756.07; 324/762.01; 324/762.1; 439/581; 439/638; 439/502; 439/79; 439/541.5; 361/785; 361/789; 174/17.08; 174/359; 174/50; 174/51; 174/53; 174/145; 174/59

(58) Field of Classification Search
  CPC ............. H05K 1/00; H05K 1/16; G01R 1/00; G01R 27/00
  USPC .................. 324/600, 76.12, 756.04–756.07, 324/762.01–762.1; 439/581, 638, 502, 79, 439/541.5; 361/785, 789; 174/17.08, 359, 174/50–53, 145, 59
  See application file for complete search history.

(56) References Cited

U.S. PATENT DOCUMENTS 5,272,664 A  * 12/1993  Alexander et al. .............. 365/52
7,046,788 B2 *  5/2006  Schmechel et al. ...... 379/221.08

(Continued)

OTHER PUBLICATIONS

Wang et al., "An Ethernet Based Data Storage Protocol for Home Network", IEEE Transactions on Consumer Electronics, May 2004, p. 543-551.*

(Continued)

*Primary Examiner* — Patrick Assouad
*Assistant Examiner* — Lamarr Brown
(74) *Attorney, Agent, or Firm* — Novak Druce Connolly Bove + Quigg LLP

(57) ABSTRACT

A signal test apparatus for a serial attached Small Computer System Interface (SAS) device includes an SAS female connector to be connected to the SAS device, an SAS male connector to be connected to a server, first and second pairs of subminiature version A (SMA) connectors, and first and second groups of switches. When the first pair of SMA connectors is connected to an oscillograph to test a pair of output signals from the SAS device, the second group of switches are turned on and the first group of switches are turned off to communicate the SAS device with the server. When the second pair of SMA connector is connected to the oscillograph to test another pair of output signals from the SAS device, the first group of switches are turned on and the second group of switches are turned off to communicate the SAS device with the server.

2 Claims, 2 Drawing Sheets

(56) References Cited

U.S. PATENT DOCUMENTS

| | | | |
|---|---|---|---|
| 7,490,176 B2* | 2/2009 | Lee | 710/17 |
| 7,913,134 B2* | 3/2011 | Kim | 714/727 |
| 7,971,110 B2* | 6/2011 | Tang | 714/716 |
| 7,979,232 B2* | 7/2011 | Einsweiler et al. | 702/108 |
| 8,140,667 B2* | 3/2012 | Keyghobad et al. | 709/224 |
| 2002/0047794 A1* | 4/2002 | Yamamoto et al. | 341/145 |
| 2004/0233143 A1* | 11/2004 | Kasai | 345/76 |
| 2006/0085701 A1* | 4/2006 | Agrawal et al. | 714/718 |
| 2006/0139854 A1* | 6/2006 | Beyers et al. | 361/600 |
| 2006/0189182 A1* | 8/2006 | Higeta et al. | 439/79 |
| 2007/0218725 A1* | 9/2007 | Liao et al. | 439/157 |
| 2008/0003845 A1* | 1/2008 | Hong et al. | 439/67 |
| 2008/0007282 A1* | 1/2008 | Hasegawa et al. | 324/757 |
| 2008/0201512 A1* | 8/2008 | Lee | 710/300 |
| 2008/0307170 A1* | 12/2008 | Lee | 711/149 |
| 2009/0113257 A1* | 4/2009 | He et al. | 714/714 |
| 2009/0168654 A1* | 7/2009 | Mies et al. | 370/241 |
| 2010/0220441 A1* | 9/2010 | Berlekamp | 361/679.54 |
| 2011/0001509 A1* | 1/2011 | Kidokoro | 324/762.01 |
| 2011/0107002 A1* | 5/2011 | Jones et al. | 710/312 |
| 2011/0291689 A1* | 12/2011 | Huang | 324/756.04 |
| 2012/0268104 A1* | 10/2012 | Huang | 324/76.12 |
| 2012/0290762 A1* | 11/2012 | Kabra et al. | 710/305 |
| 2012/0315796 A1* | 12/2012 | Pang et al. | 439/626 |
| 2013/0234742 A1* | 9/2013 | Huang | 324/750.01 |
| 2013/0237092 A1* | 9/2013 | Rubens | 439/607.23 |
| 2013/0288541 A1* | 10/2013 | Nagamine | 439/692 |

OTHER PUBLICATIONS

Dattaprasad et al., "Signal Integrity Factors in High Speed Multi-Board Test Setup", 2013 13th International Symposium on Communications and Information Technlogies (ISCIT), Sep. 2013, p. 276-281.*

* cited by examiner

SIGNAL TEST APPARATUS FOR SAS DEVICES

CROSS-REFERENCE OF RELATED APPLICATION

The present application is related to a co-pending U.S. patent application, titled "SIGNAL DETECTION APPARATUS FOR SAS DEVICES", with the application Ser. No. 13/110,985, assigned to the same assignee as the present application, and the disclosure of which is incorporated herein by reference.

BACKGROUND

1. Technical Field

The present disclosure relates to signal test apparatuses, and particularly, to a signal test apparatus for testing output signals from a serial attached Small Computer System Interface (SCSI) of an electronic device.

2. Description of Related Art

Nowadays, many electronic devices include serial attached SCSIs (SAS) for connecting SAS components, such as SAS hard disk drives (HDDs). A system, such as a server, may use a number of SAS HDDs to save data. After manufacturing but before shipping, the system needs to be tested. One test is to test output signals from the SAS HDDs. A common method is to use a probe of an oscillograph to contact the signal output pins of the SAS HDDs. However, the test result of this method may be inaccurate.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawing in which like references indicate similar elements, is illustrated by way of example and not by way of limitation. It should be noted that references to "an" or "one" embodiment in this disclosure are not necessarily to the same embodiment, and such references mean at least one.

Figure 1:
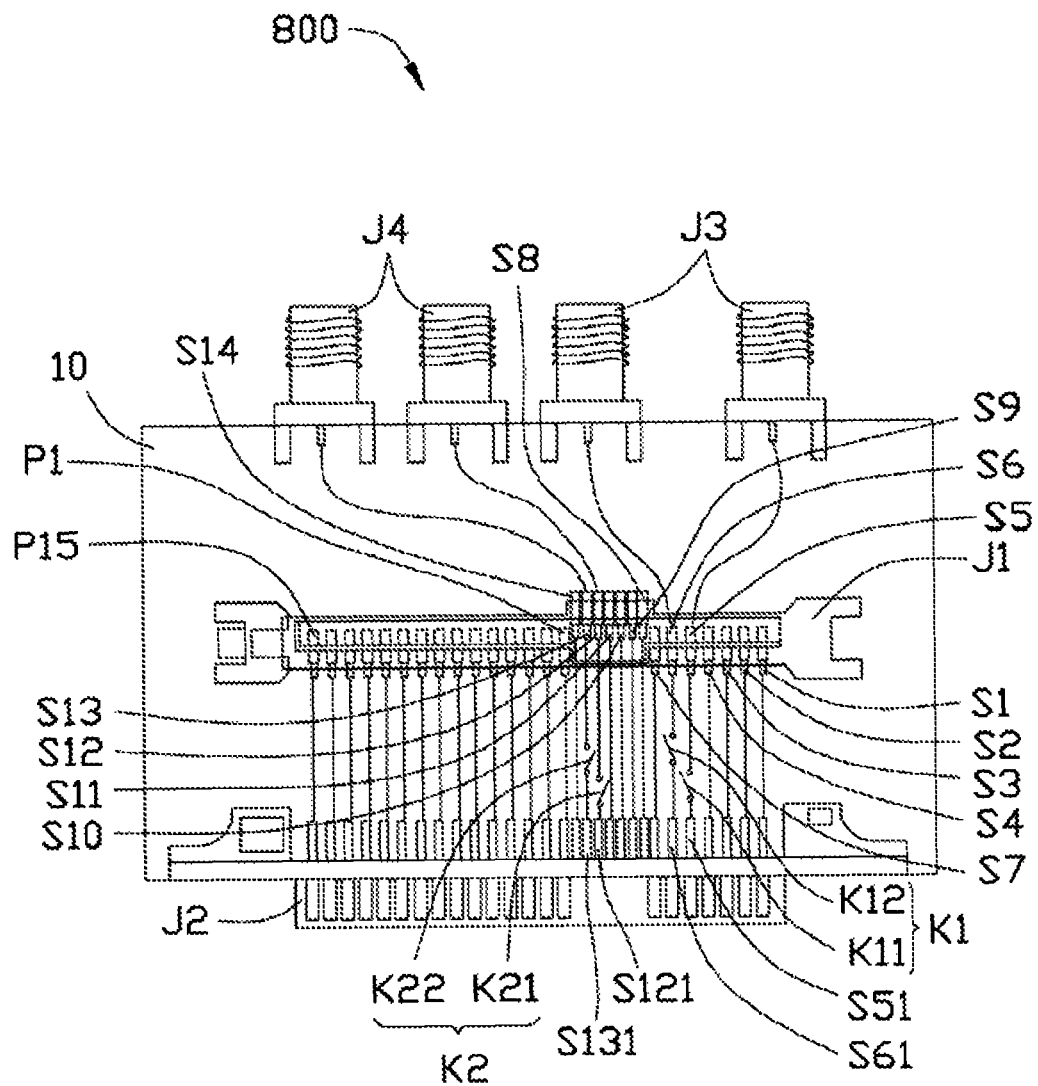
FIG. 1 is a schematic view of an embodiment of a signal test apparatus for serial attached Small Computer System Interface (SAS) devices.
Figure 2:
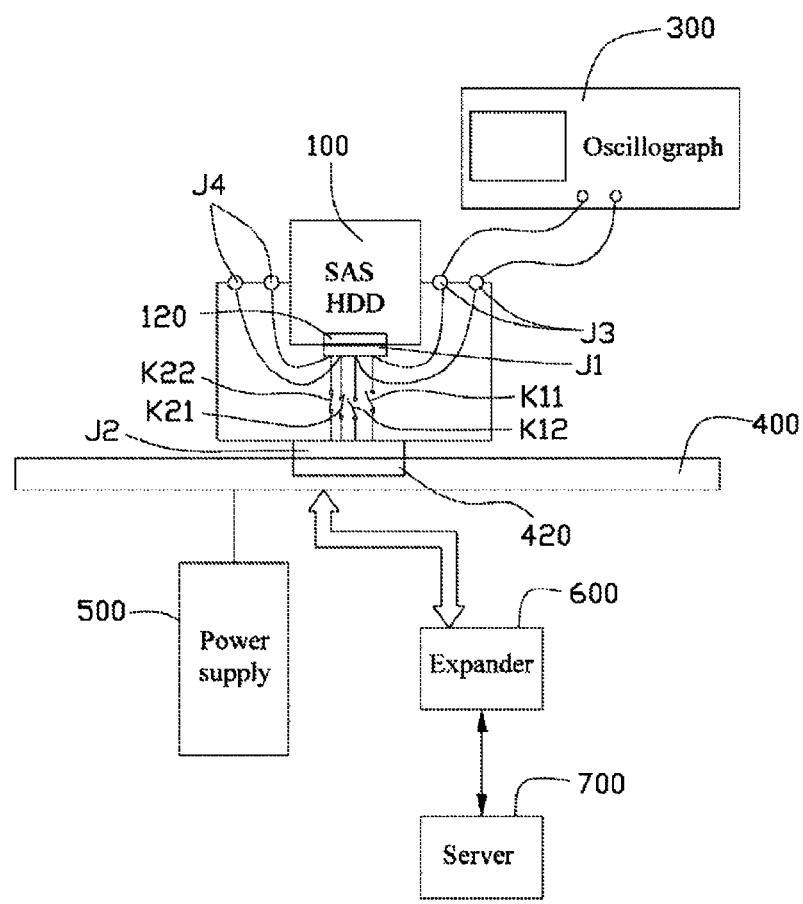
FIG. 2 is a schematic view of the signal test apparatus of FIG. 1, showing a state of use.

Referring to FIGS. 1 and 2, an embodiment of a signal test apparatus 800 for serial attached Small Computer System Interface (SCSI) (SAS) devices includes a test board 10, an SAS female connector J1, an SAS male connector J2, first and second pairs of subminiature version A (SMA) connectors J3 and J4, and first and second groups of switches K1 and K2. The SAS female connector J1 is mounted on a center of a surface of the test board 10, to be connected to an SAS male interface 120 of an SAS device, such as a hard disk drive (HDD) 100, to be tested. The SAS male connector J2 is mounted on a first side of the detecting board 10, to be connected to an SAS female interface 420 of a backboard 400 which is connected to a system, such as a server 700. The first and second pairs of SMA connectors J3 and J4 are mounted to a second side of the test board 10 opposite to the first side.

The SAS female connector J1 includes a first group of data pins S1-S7, a second group of data pins S8-S14, and a group of power pins P1-P15. In one embodiment, the impedance of each of the SMA connectors J3 and J4 is about 50 ohms.

The first group of data pins S1-S7 include a first group of ground pins S1, S4, and S7, a first group of data receiving pins S2 and S3, and a first group of data output pins S5 and S6. The second group of data pins S8-S14 includes a second group of ground pins S8, S11, and S14, a second group of data receiving pins S9 and S10, and a second group of data output pins S12 and S13. The first group of switches K1 include a first switch K11 and a second switch K12. The second group of switches K2 include a third switch K21 and a fourth switch K22.

The first group of ground pins S1, S4, and S7 and the first group of data receiving pins S2 and S3 are connected to the corresponding pins of the SAS male connector J2. First terminals of the first group of data output pins S5 and S6 are connected to the first pair of SMA connectors J3. A second terminal of the data output pin S5 is connected to corresponding pins S51 of the SAS male connector J2 through the first switch K11. A second terminal of the data output pin S6 is connected to corresponding pins S61 of the SAS male connector J2 through the second switch K12. The second group of ground pins S8, S11, and S14 and the second group of data receiving pins S9 and S10 are connected to the corresponding pins of the SAS male connector J2. The second group of data output pins S12 and S13 are connected to the second pair of SMA connectors J4. First terminals of the second group of data output pins S12 and S13 are connected to the second pair of SMA connectors J4. A second terminal of the data output pin S12 is connected to corresponding pins S121 of the SAS male connector J2 through the third switch K21. A second terminal of the data output pin S13 is connected to corresponding pins S131 of the SAS male connector J2 through the fourth switch K22.

Referring to FIG. 2, in use, the SAS male interface 120 of the SAS HDD 100 is connected to the SAS female connector J1 of the test board 10. The SAS male connector J2 is connected to the SAS female interface 420 of the backboard 400. When one pair of output signals corresponding to the first pair of SMA connectors J3 from the SAS HDD 100 needs to be tested, the first pair of SMA connectors J3 is connected to a pair of probes of an oscillograph 300. The third and fourth switches K21 and K22 are turned on, and the first and second switches K11 and K12 are turned off.

In use, the backboard 400 is further connected to a plurality of power supplies 500, to supply power to the SAS HDD 100. The backboard 400 is also connected to the server 700 through an expander 600. The server 700 is used to output control signals to the SAS HDD 100 through the expander 600 and the backboard 400. It may be understood that the system also includes other elements, such as central processing units. These other elements fall within well-known technologies, and are therefore not described here.

To test the SAS interface 120 of the SAS HDD 100, the server 700 transmits control signals to the SAS HDD 100 through the expander 600, the backboard 400, the SAS male connector J2, and the second group of data pins S8-S14 of the SAS female connector J1. The SAS HDD 100 is set with some predetermined parameters, such as voltage ranges and test codes, by the control signals from the server 700. The first data output pins S5 and S6 of the first group of data pins S1-S7 of the SAS female connector J1 then receive a pair of output signals from the SAS HDD 100, and output the pair of output signals to the oscillograph 300 through the first pair of SMA connectors J3. Because the received output signals from the SAS HDD 100 are already set by the server 700 to satisfy impedance requirements, the test result read from the oscillograph 300 is accurate.

Similarly, when another pair of output signals corresponding to the second pair of SMA connectors J4 from the SAS HDD 100 is tested, the second pair of SMA connectors J4 is connected to the oscillograph 300. The first and second switches K11 and K12 are turned on, and the third and fourth switches K21 and K22 are turned off. The server 700 transmits control signals to the SAS HDD 100 through the expander 600, the backboard 400, the SAS male connector J2, and the first group of data pins S1-S7 of the SAS female connector J1. The second data output pins S12 and S13 of the second group of data pins S8-S14 of the SAS female connector J1 then receive the corresponding output signals from the SAS HDD 100, and output the output signals to the oscillograph 300 through the second pair of SMA connectors J4. Because the received output signals from the SAS HDD 100 are already set by the server 700 according to impedance requirements, the test result read from the oscillograph 300 is accurate.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A signal test apparatus for a serial attached Small Computer System Interface (SAS) device, the signal test apparatus comprising:

a test board;

an SAS female connector mounted on the test board to be connected to the SAS device, the SAS female connector comprising a first group of ground pins, a first group of data receiving pins, a first group of data output pins, a second group of ground pins, a second group of data receiving pins, a second group of data output pins, and a first group of power pins;

an SAS male connector mounted on the test board to be connected to a server, the SAS male connector comprising a third group of ground pins, a third group of data receiving pins, a third group of data output pins, a fourth group of ground pins, a fourth group of data receiving pins, a fourth group of data output pins, and a second group of power pins;

first and second pairs of subminiature version A (SMA) connectors mounted on the test board; and first and second groups of switches;

wherein the first group of power pins are connected to the second group of power pins, the first group of ground pins are connected to the third group of ground pins, the first group of data receiving pins are connected to the third group of data receiving pins, the second group of ground pins are connected to the fourth group of ground pins, the second group of data receiving pins are connected to the fourth group of data receiving pins, first terminals of the first group of data output pins are connected to the first pair of SMA connectors, second terminals of the first group of data output pins are connected to the third group of data output pins through the first group of switches, first terminals of the second group of data output pins are connected to the second pair of SMA connectors, second terminals of the second group of data output pins are connected to the third group of data output pins through the second group of switches; and wherein when the first pair of SMA connectors is connected to an oscillograph to test a pair of output signals from the SAS device, the second group of switches are turned on and the first group of switches are turned off to communicate the SAS device with the server; wherein when the second pair of SMA connectors is connected to the oscillograph to test another pair of output signals from the SAS device, the first group of switches are turned on and the second group of switches are turned off to communicate the SAS device with the server.

2. The signal detection apparatus of claim 1, wherein impedance of each of the first and second pairs of SMA connectors is about 50 ohms.

* * * * *